US012142335B2

(12) United States Patent
Buch et al.

(10) Patent No.: US 12,142,335 B2
(45) Date of Patent: Nov. 12, 2024

(54) ADDRESS FAULT DETECTION

(71) Applicant: Micron Technology, Inc., Boise, ID (US)

(72) Inventors: Steffen Buch, Munich (DE); Melissa I. Uribe, El Dorado Hills, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/080,369

(22) Filed: Dec. 13, 2022

(65) Prior Publication Data

US 2023/0197180 A1     Jun. 22, 2023

Related U.S. Application Data

(60) Provisional application No. 63/291,806, filed on Dec. 20, 2021.

(51) Int. Cl.
*G11C 29/00* (2006.01)
*G11C 29/42* (2006.01)

(52) U.S. Cl.
CPC ...... *G11C 29/42* (2013.01); *G11C 2211/5641* (2013.01)

(58) Field of Classification Search
CPC ......... G11C 29/42; G11C 29/52; G11C 16/26; G06F 11/1044; G06F 11/1032; G06F 11/108; G06F 11/1076
See application file for complete search history.

(56) References Cited

U.S. PATENT DOCUMENTS

| | | | | |
|---|---|---|---|---|
| 7,823,052 B2* | 10/2010 | Yu | ............ | H04L 1/0067 |
| | | | | 714/755 |
| 8,437,183 B2* | 5/2013 | Sharon | ............ | G06F 11/1072 |
| | | | | 714/766 |
| 9,959,168 B2* | 5/2018 | Achtenberg | ...... | H03M 13/2909 |
| 10,567,006 B2* | 2/2020 | Hahn | ............ | G06F 3/0619 |
| 11,169,881 B2* | 11/2021 | Li | ............ | H03M 13/6502 |

* cited by examiner

*Primary Examiner* — Esaw T Abraham
(74) *Attorney, Agent, or Firm* — Holland & Hart LLP

(57) ABSTRACT

Methods, systems, and devices for address fault detection are described. In some examples, a memory device may receive a command (e.g., a write command) and data, and may generate a set of parity bits based on an address of the command and the data. The data and the set of parity bits may be stored to respective portions of a memory array. In some examples, the memory device may receive a command (e.g., a read command) for the data. The memory device may read the data and may generate a set of parity bits (e.g., a second set of parity bits) based on an address of the command and the read data. The sets of parity bits may be compared to determine whether an error associated with the data exists, an error associated with an address path of the memory exists, or both.

20 Claims, 9 Drawing Sheets

ADDRESS FAULT DETECTION

CROSS REFERENCE

The present Application for Patent claims priority to U.S. Patent Application No. 63/291,806 by BUCH et al., entitled "ADDRESS FAULT DETECTION," filed Dec. 20, 2021, which is assigned to the assignee hereof, and which is expressly incorporated by reference herein.

FIELD OF TECHNOLOGY

The following relates generally to one or more systems for memory and more specifically to address fault detection.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
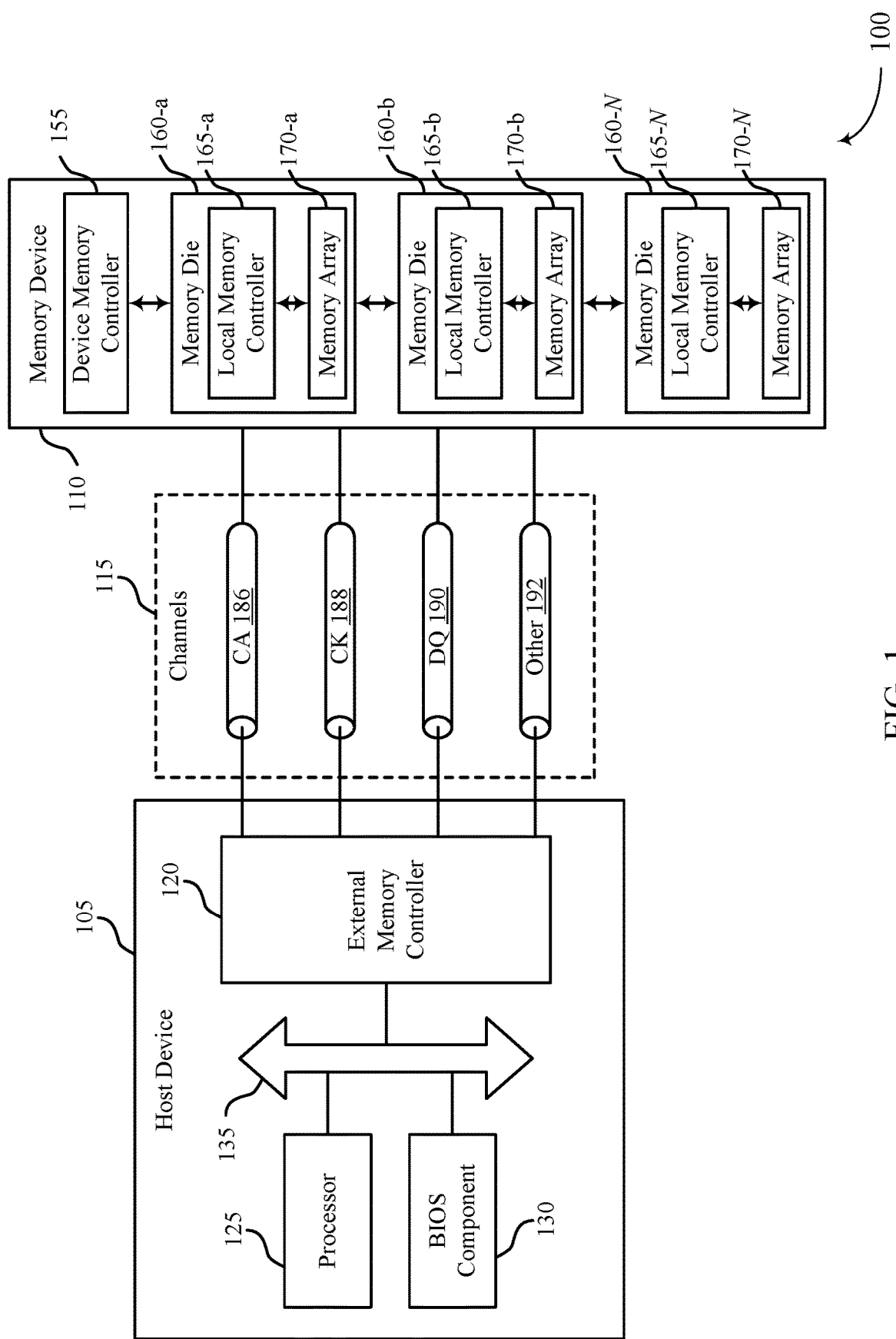
FIG. 1 illustrates an example of a system that supports address fault detection in accordance with examples as disclosed herein.

Some memory devices may include circuitry configured to detect errors associated with various operations or various components of the memory device. Such memory devices may be incorporated in environments such as vehicle safety systems, autonomous vehicle systems, or other safety-critical systems, that may have strict requirements regarding undetected failure rates (FITs). For example, while errors associated with accessing (e.g., reading and writing) data may be detected, errors or faults associated with an address path may often go undetected. That is, if a fault exists in an address path of a memory device, data may still be written to or read from the memory device, but may be written to or read from an incorrect address. Thus, the data may not contain any errors (e.g., the data may be valid), but may result in an unintended or undesirable error. Accordingly, a memory device configured to detect errors or faults in an address path may be desirable.

A memory device configured to detect errors or faults in an address path is described herein. In some examples, the memory device may be configured to detect errors or faults in the address path by utilizing an error control code to generate a set of parity bits based on both an address and user data. For example, during a write command, user data and an address (e.g., an address of the memory device to write the user data to) may be received (e.g., from a host device). Circuitry of the memory device may generate a first set of parity bits (e.g., using the error control code) that is based on the user data and the address. The user data and the parity bits may then be stored to the memory device (e.g., to different portions of the memory device).

After the data and parity bits are stored, the memory device may receive a read command for the data (e.g., the data previously stored to the memory device). The read command may include an address corresponding to a location of the memory device where the data was stored. Accordingly, the data may be read from the address and circuitry of the memory device may generate a second set of parity bits (e.g., using the error control code) that is based on the read data and the received address. The first set of parity bits may also be read from the memory device and compared with the second set of parity bits. If the parity bits match, then errors may not exist with either the data or with the address path. However, if the parity bits do not match, then one or more errors associated with the data or with the address path may exist and further error detection may be conducted to determine the source of the error. Accordingly, by performing the operations described herein, errors associated with an address path of a memory device may be identified, which may prevent unintended or undesirable errors that may otherwise occur due to writing data to or reading data from an incorrect location.

Features of the disclosure are initially described in the context of systems and dies as described with reference to FIGS. 1 and 2. Features of the disclosure are described in the context of systems and process flow diagrams as described with reference to FIGS. 3-6. These and other features of the disclosure are further illustrated by and described with reference to an apparatus diagram and flowcharts that relate to address fault detection as described with reference to FIGS. 7-9.

FIG. 1 illustrates an example of a system 100 that supports address fault detection in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 (e.g., memory die 160-a, memory die 160-b, memory die 160-N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, commands carried by the CA channel 186 may include a read command with an address of the desired data. In some examples, a CA channel 186 may include any quantity of signal paths to decode one or more of address or command data (e.g., eight or nine signal paths).

In some examples, data channels 190) may be operable to communicate one or more of data or control information between the host device 105 and the memory device 110. For example, the data channels 190) may communicate information (e.g., bi-directional) to be written to the memory device 110 or information read from the memory device 110.

The channels 115 may include any quantity of signal paths (including a single signal path). In some examples, a channel 115 may include multiple individual signal paths. For example, a channel may be ×4 (e.g., including four signal paths), ×8 (e.g., including eight signal paths), ×16 (including sixteen signal paths), etc.

In some examples, the one or more other channels 192 may include one or more error detection code (EDC) channels. The EDC channels may be operable to communicate error detection signals, such as checksums, to improve system reliability. An EDC channel may include any quantity of signal paths.

In some examples, the memory device 110 may include circuitry configured to detect errors in the CA channels 186. For example, a write command may be received from the host device 105 via the CA channels 186 and user data may be received from the host device 105 via the DQ channels 190. Upon receiving the command and user data, circuitry included in the memory device 110 may generate a set of parity bits (e.g., a first set of parity bits), using an error control code (e.g., a Hamming code), based on an address included in the command and the user data. The device memory controller 155 may then write the user data to the address (e.g., the address included in the command received from the host device 105) and may also write the first set of parity bits to a different portion of the memory device 110. For example, the user data may be written to a first portion of the memory array 170-a and the first set of parity bits may be written to a second portion (e.g., a different portion) of the memory array 170-a.

After writing the user data and the first set of parity bits to the memory array 170-a, the memory device 110 may receive a read command for the data. The read command may be received via the CA channels 186. Upon receiving the read command, the device memory controller 155 may read the data from the address (e.g., from the first portion of the memory array 170-a) and may generate a set of parity bits (e.g., a second set of parity bits), using the error control code, based on the address and the read user data. The device memory controller 155 may then read the first set of parity bits from the second portion of the memory array 170-a and circuitry included in the memory device 110 may compare the first set of parity bits with the second set of parity bits.

If the parity bits match, then errors may not exist with either the data or with the CA channels 186. However, if the parity bits do not match, then one or more errors associated with the user data or with the CA channels 186 may exist and further error detection may be conducted to determine the source of the error. Accordingly, by performing the operations described herein, errors associated with the CA channels 186 of the memory device 110 may be identified, which may prevent unintended or undesirable errors that may otherwise occur due to writing data to or reading data from an incorrect location.

Figure 2:
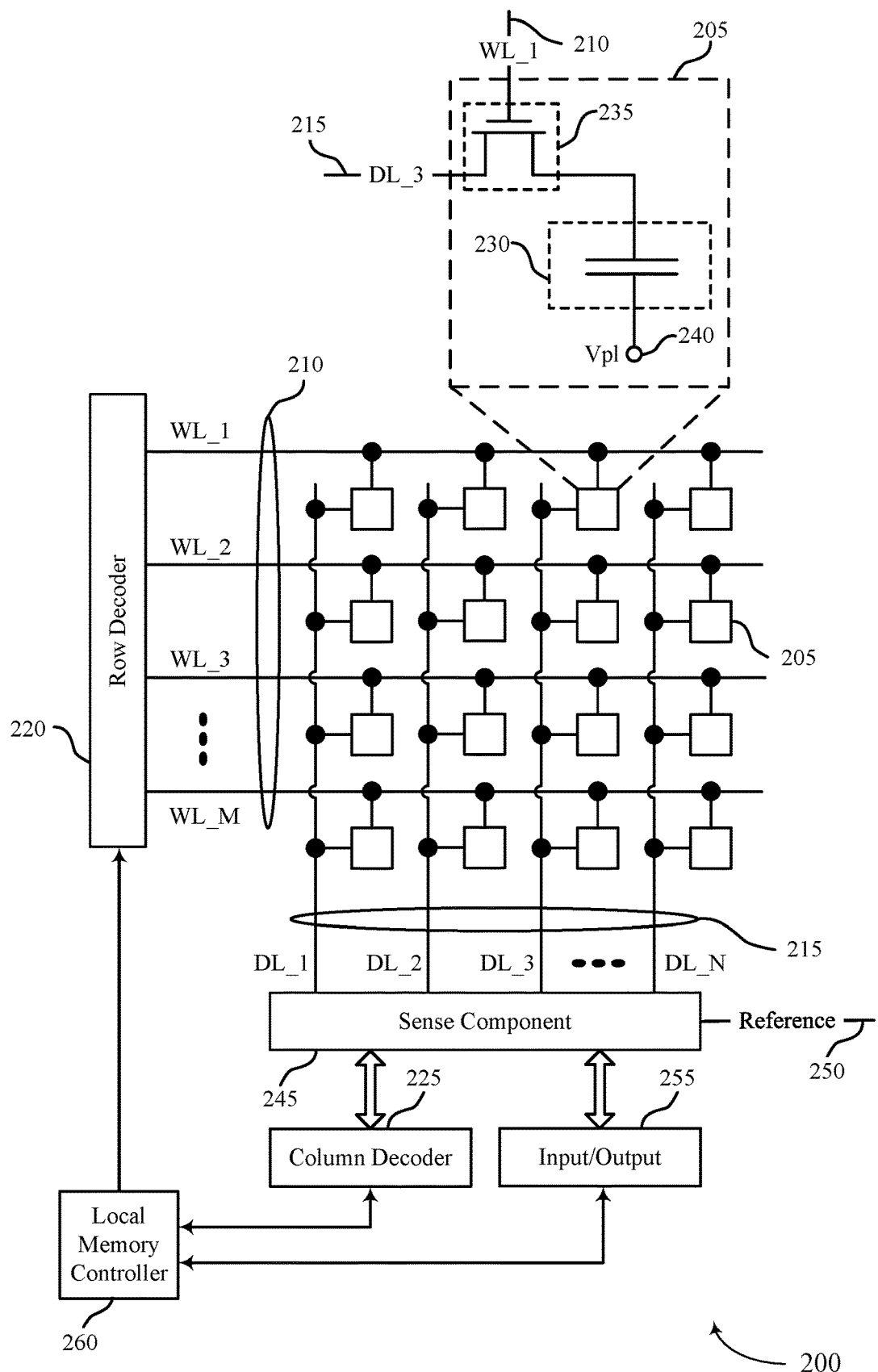
FIG. 2 illustrates an example of a memory die that supports address fault detection in accordance with examples as disclosed herein.

FIG. 2 illustrates an example of a memory die 200 that supports address fault detection in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0) or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235. The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include one or more access lines (e.g., one or more word lines 210 and one or more digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding or operation. Memory cells 205 may be positioned at intersections of the word lines 210 and the digit lines 215.

Operations such as reading and writing may be performed on the memory cells 205 by activating or selecting access lines such as one or more of a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in either a two-dimensional or three-dimensional configuration may be referred to as an address of a memory cell 205.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target word line 210 and the target digit line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

The local memory controller 260 may be operable to perform a write operation (e.g., a programming operation) on one or more memory cells 205 of the memory die 200. During a write operation, a memory cell 205 of the memory die 200 may be programmed to store a desired logic state.

The local memory controller 260 may identify a target memory cell 205 on which to perform the write operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The local memory controller 260 may apply a specific signal (e.g., write pulse) to the digit line 215 during the write operation to store a specific state (e.g., charge) in the capacitor 230 of the memory cell 205. The pulse used as part of the write operation may include one or more voltage levels over a duration.

The local memory controller 260 may be operable to perform a read operation (e.g., a sense operation) on one or more memory cells 205 of the memory die 200. During a read operation, the logic state stored in a memory cell 205 of the memory die 200 may be determined. The local memory controller 260 may identify a target memory cell 205 on which to perform the read operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210) or digit line 215) to access the target memory cell 205. The target memory cell 205 may transfer a signal to the sense component 245 in response to biasing the access lines. The sense component 245 may amplify the signal. The local memory controller 260 may activate the sense component 245 (e.g., latch the sense component) and thereby compare the signal received from the memory cell 205 to the reference 250. Based on that comparison, the sense component 245 may determine a logic state that is stored on the memory cell 205.

In some examples, the memory die 200 may be coupled with circuitry configured to detect errors in one or more address channels (e.g., one or more address channels coupled with the memory die 200). For example, a write command may be received from a host device via an address channel and user data may be received from the host device via a data channel. Upon receiving the command and user data, circuitry coupled with the memory die 200 may generate a set of parity bits (e.g., a first set of parity bits), using an error control code (e.g., a Hamming code), based on an address included in the command and the user data. The device local memory controller 260 may then write the user data to the address (e.g., the address included in the command received from the host device) and may also write the first set of parity bits to a different portion of the memory die 200. For example, the user data may be written to a first portion of the memory die 200 and the first set of parity bits may be written to a second portion (e.g., a different portion) of the memory die 200.

After writing the user data and the first set of parity bits to the memory die 200, local memory controller 260 may receive a read command for the data. The read command may be received via an address channel coupled with the memory die 200. Upon receiving the read command, the local memory controller 260 may read the data from the address (e.g., from the first portion of the memory die 200) and may generate a set of parity bits (e.g., a second set of parity bits), using the error control code, based on the address and the read user data. The local memory controller 260 may then read the first set of parity bits from the second portion of the memory die 200 and circuitry coupled with the memory die 200 may compare the first set of parity bits with the second set of parity bits.

If the parity bits match, then errors may not exist with either the user data or with the address channel. However, if the parity bits do not match, then one or more errors associated with the user data or with the address channel may exist and further error detection may be conducted to determine the source of the error. Accordingly, by performing the operations described herein, errors associated with the address channels coupled with the memory die 200 may be identified, which may prevent unintended or undesirable errors that may otherwise occur due to writing data to or reading data from an incorrect location.

Figure 3:
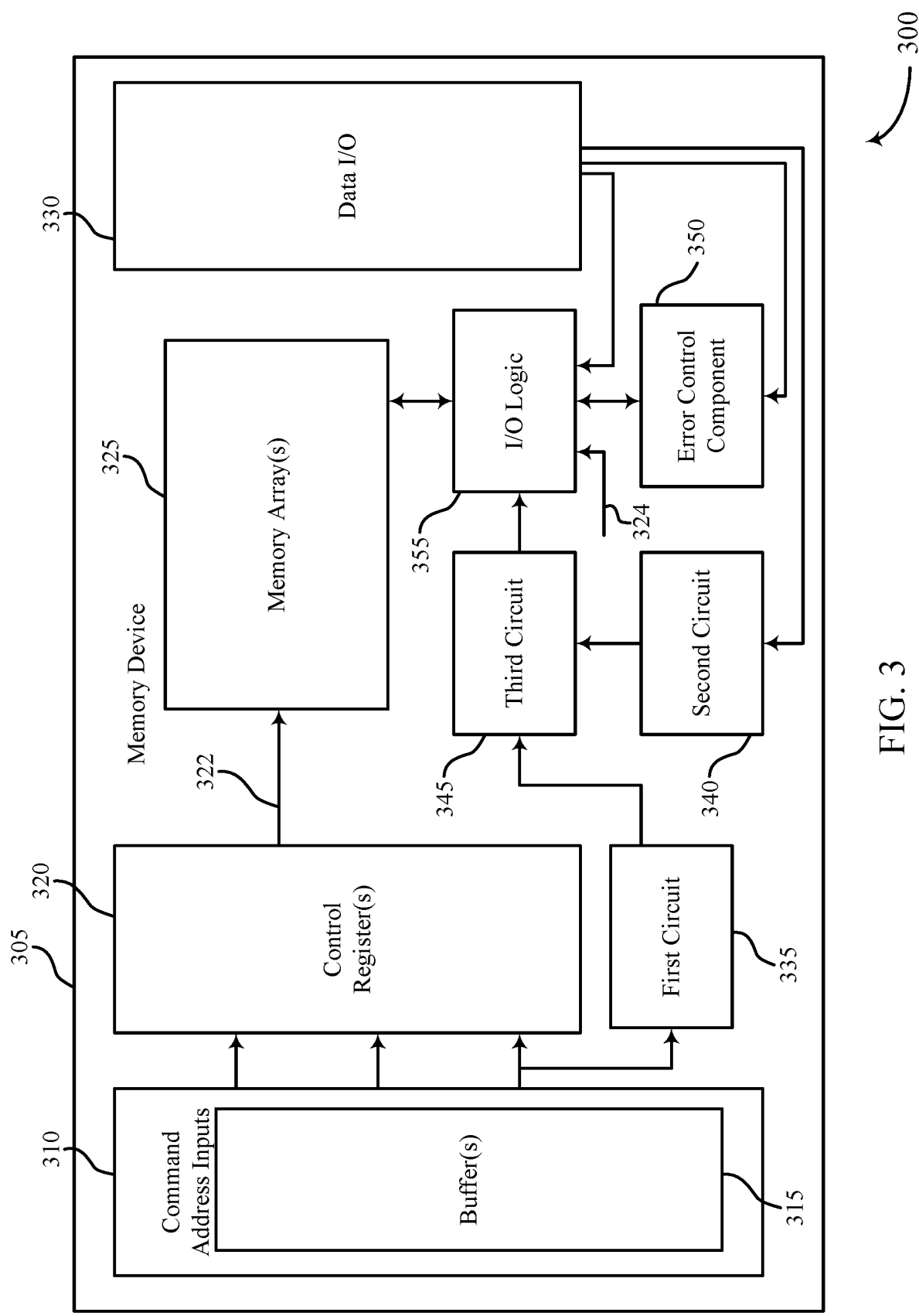
FIG. 3 illustrates an example of a memory system that supports address fault detection in accordance with examples as disclosed herein.

FIG. 3 illustrates an example of a memory system 300 that supports address fault detection in accordance with examples as disclosed herein. In some examples, the memory system 300 may include a memory device 305, which may be an example of the memory device 110 as described with reference to FIG. 1. The memory system 300 may illustrate and describe components in the context of a write operation received by the memory device 305.

The memory device 305 may include command address (CA) inputs 310, one or more control registers 320, one or more memory arrays 325, a data input/output (I/O) component 330, a first circuit 335, a second circuit 340, a third circuit 345, an error control component 350, and an I/O logic component 355. CA inputs 310 may include one or more buffers 315. In some examples, the circuitry described herein may be configured to generate one or more sets of parity bits, which may be used to determine whether errors or faults exist in an address path coupled with the memory device 305. Determining whether an error or fault exists in an address path may prevent unintended or undesirable errors that may otherwise occur due to writing data to or reading data from an incorrect location of a memory array 325.

The CA inputs 310 may be coupled with one or more channels that are coupled with a host device (e.g., a host device 105 as described with reference to FIG. 1). For example, the CA inputs 310 may be coupled with one or more CA channels (e.g., one or more CA channels 186 as described with reference to FIG. 1), one or more CK channels (e.g., one or more CK channels 188 as described with reference to FIG. 1), and one or more chip select (CS) channels. In some instances, the memory device 305 may receive an address of a command (e.g., a write command) over the CA channels coupled with the CA inputs 310. Accordingly, the error detection operations described herein may identify whether errors or faults associated with the CA channels exist.

In some examples, the CA inputs 310 may include or may be coupled with one or more buffers 315. For example, the buffers 315 may include clock input buffers, control input buffers, and CA input buffers. The buffers may be configured to buffer respective commands or signaling received via the CA channels, the CK channels, and the CS channels described herein.

The CA inputs 310 may be coupled with one or more control registers 320. The control register(s) 320 may include refresh logic, fuse array logic, CA decoders, mode registers, test mode logic, and other similar components. In some examples, the memory device 305 may include one control register 320 for each memory array 325, while in other examples, the memory device 305 may include one control register 320 that is coupled with each memory array 325 of the memory device 305. In some examples, when a command (e.g., a write command) is received at the CA inputs 310, the control register 320 may decode the received address into a row address and a column address. The row and column addresses may be used to write data to the associated memory array 325 (e.g., the memory array 325 associated with the decoded command).

The control register(s) 320 may be coupled with one or more memory arrays 325. In some examples, the memory device 305 may include a plurality of memory arrays 325, and each memory array may include a plurality of memory cells. The memory arrays 325 may each include a plurality of volatile memory cells, such as DRAM memory cells, or may include a plurality of non-volatile memory cells, such as FeRAM memory cells or NAND memory cells (e.g., Flash memory cells). The type and quantity of memory cells included in each memory array 325 may be a matter of design choice.

In some examples, each memory array 325 may be an example of a bank (e.g., a bank of memory cells). Additionally or alternatively, some memory arrays 325 may be associated with values for some of the address bits. That is, some address bits (e.g., received by the CA inputs 310) may be decoded to determine an activated memory array 325, and some address bits may determine an address within the activated memory array 325. Some address bits may thus be decoded and transmitted to each of the memory arrays 325 whether the respective memory array 325 is activated or not. However, if a memory array 325 is not activated, a command may not be performed on the respective memory array 325. In some cases, control register(s) 320 may decode the address received by the CA inputs 310 into a row address 322 and a column address 324. The row address 322 may represent a physical row (e.g., page) of the memory array 325 for access, and column address 324 may represent a portion of the row to be accessed (e.g., input or output from the memory array 325) by a particular access command. The quantities of bits or bit values of row address 322 and column address 324 may be different from the bit values of the CA inputs 310 (e.g., the decoded row and column address may be different from the address received from a host device). Thus, although row address 322 and column address 324 may be sent to each of the memory arrays 325, use of row address 322 and column address 324 in parity information would not protect from errors in decoding logic in control registers 320.

The memory device 305 may include a data I/O component 330. The data I/O component 330 may be coupled with one or more channels that are coupled with a host device (e.g., a host device 105 as described with reference to FIG. 1). For example, the data I/O component 330 may be coupled with one or more DQ channels (e.g., one or more DQ channels 190 as described with reference to FIG. 1). Accordingly, the data I/O component 330 may receive user data associated with a write command received by the CA inputs 310.

In some examples, the memory device 305 may include a first circuit 335 for generating a set of parity bits (e.g., a first set of intermediate parity bits). The first circuit 335 may be an example of an exclusive-or (XOR) tree that includes a plurality of XOR gates. For example, when the memory device 305 receives a write command (e.g., at the CA inputs 310), the address bits associated with the write command may be transmitted to the control register(s) 320 for decoding, and also to the first circuit 335. The first circuit 335 may generate a first set of intermediate parity bits using the address bits. The first set of intermediate parity bits may include a lesser quantity of bits than received by the CA inputs 310. For example, the CA inputs 310 may receive twenty-nine (29) address bits and the first circuit 335 may generate eight (8) intermediate parity bits.

The memory device 305 may include a second circuit 340 for generating a set of parity bits (e.g., a second set of intermediate parity bits). The second circuit 340 may be an example of an XOR tree that includes a plurality of XOR gates. For example, when the memory device 305 receives user data for a write command (e.g., at the data I/O component 330), the data bits may be transmitted to a respective memory array 325 (e.g., via the error control component 350) and/or I/O logic component 355), and also to the second circuit 340). The second circuit 340 may generate a second set of intermediate parity bits using the user data. The second set of intermediate parity bits may include a lesser quantity of bits than received by the data I/O component 330. For example, the data I/O component 330 may receive one hundred twenty-eight (128) address bits and the second circuit 340 may generate eight (8) intermediate parity bits.

In some examples, the memory device 305 may include a third circuit 345 for generating a set of parity bits based on the intermediate parity bits generated by the first circuit 335 and the second circuit 340. The third circuit 345 may be an example of a bitwise XOR that includes a plurality of XOR gates. For example, the third circuit 345 may perform a binary operation that takes two bit patterns of equal length (e.g., the first set of intermediate parity bits and the second set of intermediate parity bits) and performs an XOR operation on each pair of corresponding bits. The third circuit 345 may thus generate a set of parity bits (e.g., a first set of parity bits) that provides parity information for the address received by the CA inputs 310 and the user data received by the data I/O component 330. The first set of parity bits may include a same quantity of bits as the quantities of bits generated by the first circuit 335 and the second circuit 340. For example, the third circuit 345 may generate eight (8) parity bits that may be stored to a portion of the memory array 325 associated with the write command.

By including the first circuit 335, the second circuit 340, and the third circuit 345 in the memory device, the address bits received by the CA inputs 310 may not be routed to each memory array 325 for parity generation. That is, the address bits may be routed to the first circuit 335, which may then generate the first set of intermediate parity bits, which may be routed to each of the memory arrays 325. The first circuit may be located close to the command address inputs 310. As described herein, the first set of intermediate parity bits may include a lesser quantity of bits than the received address bits. Accordingly, fewer bits may then be routed to different memory arrays 325 of the memory device 305. Accordingly, the size of memory device 305 may be reduced as compared to routing each of the address bits for generation of parity information at the memory arrays 325 by including and/or utilizing the first circuit 335, the second circuit 340, and the third circuit 345.

The memory device 305 may include an error control component 350 for generating a set of parity bits based on an address received by the CA inputs 310 and user data received by the data I/O component 330. That is, in some examples, the memory device 305 may not utilize the first circuit 335, the second circuit 340, or the third circuit 345 to generate respective sets of parity bits. Instead, address bits may be transmitted from the CA inputs 310 to the error control component 350, and the user data may be transmitted from the data I/O component 330 to the error control component 350. The error control component 330 may then generate a set of parity bits using an error control code, such as a Hamming code. The set of parity bits generated by the error control component 350 may include a lesser quantity of bits than received by the CA inputs 310 and by the data I/O component 330. For example, the CA inputs 310 may receive twenty-nine (29) address bits, the data I/O component 330 may receive one hundred twenty-eight (128) data bits, and the error control component 350 may generate eight (8) parity bits. However, in other examples, the CA inputs 310 and the data I/O component 330 may receive a greater or lesser quantity of bits (e.g., address bits, data bits) and the error control component 350 may generate a greater or lesser quantity of parity bits.

The third circuit 345 and the error control component 350 may be coupled with an I/O logic component 355 that is coupled with each of the memory arrays 325. The I/O logic component 355 may transmit the generated parity bits (e.g., the parity bits generated by either the third circuit 345 or the error control component 350) to the respective memory array 325. As described herein, the generated parity bits may be stored to a same memory array 325 as the corresponding data, but may be stored to a different portion of the memory array 325 that is inaccessible by a host device.

Although the memory device 305 illustrates various components being coupled with others, any of the components of the memory device 305 may be coupled together (or may not be coupled together despite being illustrated as such). Moreover, some components may be optional components and thus may not be implemented in a memory device 305. However, the memory device 305 may be configured to generate one or more sets of parity bits, which may be used to determine whether errors or faults exist in an address path coupled with the memory device 305 (e.g., coupled with the CA inputs 310). Determining whether an error or fault exists in an address path may prevent unintended or undesirable errors that may otherwise occur due to writing data to or reading data from an incorrect location of a memory array 325.

Figure 4:
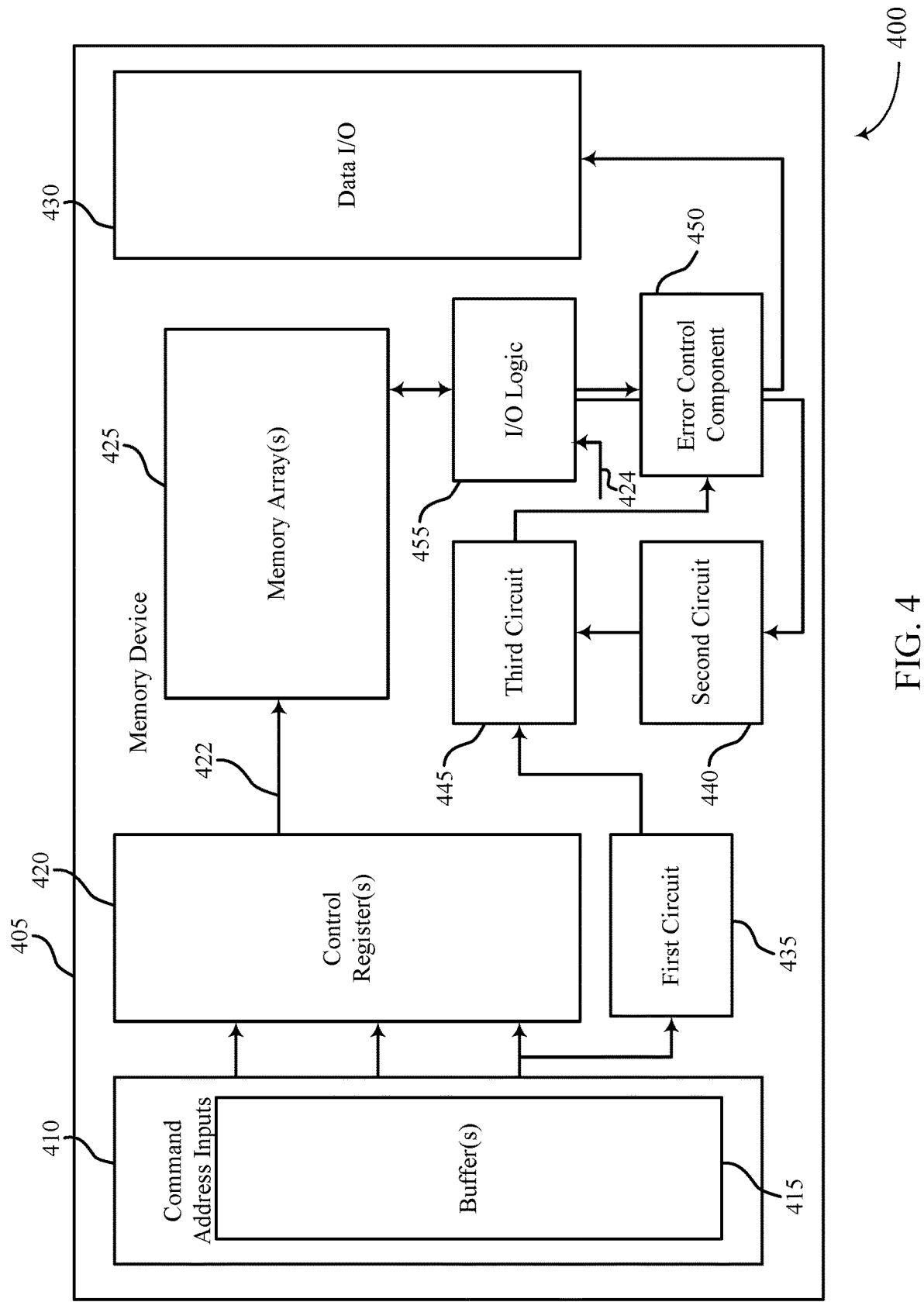
FIG. 4 illustrates an example of a memory system that supports address fault detection in accordance with examples as disclosed herein.

FIG. 4 illustrates an example of a memory system 400 that supports address fault detection in accordance with examples as disclosed herein. In some examples, the memory system 400 may be an example of the memory system 300 described with reference to FIG. 3, but may illustrate and describe components in the context of a read operation. The components and circuitry of the memory device 405 may be configured to read parity bits (e.g., read a first set of parity bits) from a respective memory array 325 upon receiving a read command. Moreover, the circuitry described herein may be configured to generate one or more sets of parity bits (e.g., a second set of parity bits) based on the received read command and data read from the respective memory array 425. Accordingly, the memory device 405 may be configured to determine whether errors or faults exist in an address path coupled with the memory device 405, which may prevent unintended or undesirable errors that may otherwise occur due to writing data to or reading data from an incorrect location of a memory array 425.

The CA inputs 410 may be coupled with one or more channels that are coupled with a host device (e.g., a host device 105 as described with reference to FIG. 1). For example, the CA inputs 410 may be coupled with one or more CA channels (e.g., one or more CA channels 186 as described with reference to FIG. 1), one or more CK channels (e.g., one or more CK channels 188 as described with reference to FIG. 1), and one or more chip select (CS) channels. In some instances, the memory device 405 may receive an address of a command (e.g., a read command) over the CA channels coupled with the CA inputs 410. Accordingly, the error detection operations described herein may identify whether errors or faults associated with the CA channels exist.

In some examples, the CA inputs 410 may include or may be coupled with one or more buffers 415. For example, the buffers 415 may include clock input buffers, control input buffers, and CA input buffers. The buffers may be configured to buffer respective commands or signaling received via the CA channels, the CK channels, and the CS channels described herein.

The CA inputs 410 may be coupled with one or more control registers 420. The control register(s) 420 may include refresh logic, fuse array logic, CA decoders, mode registers, test mode logic, and other similar components. In some examples, the memory device 405 may include one control register 420 for each memory array 425, while in other examples, the memory device 405 may include one control register 420 that is coupled with each memory array 425 of the memory device 405. In some examples, when a command (e.g., a read command) is received at the CA inputs 410, the control register 420 may decode the received address into a row address and a column address. The row and column addresses may be used to read data from the associated memory array 425 (e.g., the memory array 325 associated with the decoded command).

The control register(s) 420 may be coupled with one or more memory arrays 425. In some examples, the memory device 405 may include a plurality of memory arrays 425, and each memory array may include a plurality of memory cells. The memory arrays 425 may each include a plurality of volatile memory cells, such as DRAM memory cells, or may include a plurality of non-volatile memory cells, such as FeRAM memory cells or NAND memory cells (e.g., Flash memory cells). The type and quantity of memory cells included in each memory array 425 may be a matter of design choice. In some cases, control register(s) 420 may decode the address received by the CA inputs 410 into a row address 422 and a column address 424. The row address 422 may represent a physical row (e.g., page) of the memory array 425 for access, and column address 424 may represent a portion of the row to be accessed (e.g., input or output from the memory array 425) by a particular access command. The quantities of bits or bit values of row address 422 and column address 424 may be different from the bit values of the CA inputs 410 (e.g., the decoded row and column address may be different from the address received from a host device). Thus, although row address 422 and column address 424 may be sent to each of the memory arrays 425, use of row address 422 and column address 424 in parity information would not protect from errors in decoding logic in control registers 420.

The memory device 405 may include a data I/O component 430. The data I/O component 430) may be coupled with one or more channels that are coupled with a host device (e.g., a host device 105 as described with reference to FIG. 1). For example, the data I/O component 430 may be coupled with one or more DQ channels (e.g., one or more DQ channels 190 as described with reference to FIG. 1). As described herein, when the memory device 305 receives a read command (e.g., at the CA inputs 410), the data I/O component 430 may output a result of an error detection operation to a host device.

In some examples, the memory device 405 may include a first circuit 435 for generating a set of parity bits (e.g., a first set of intermediate parity bits). The first circuit 335 may be an example of an XOR tree that includes a plurality of XOR gates. For example, when the memory device 405 receives a read command (e.g., at the CA inputs 410), the address bits associated with the read command may be transmitted to the control register(s) 420 for decoding, and also to the first circuit 435. The first circuit 435 may generate a first set of intermediate parity bits using the address bits. The first set of intermediate parity bits may include a lesser quantity of bits than received by the CA inputs 410. For example, the CA inputs 410 may receive twenty-nine (29) address bits and the first circuit 435 may generate eight (8) intermediate parity bits. However, in other examples, the CA inputs 410 may receive a greater or lesser quantity of address bits and the first circuit 435 may generate a greater or lesser quantity of intermediate parity bits.

The memory device 405 may include a second circuit 440 for generating a set of parity bits (e.g., a second set of intermediate parity bits). The second circuit 440 may be an example of an XOR tree that includes a plurality of XOR gates. For example, when the address is decoded by the control register(s) 420, the corresponding data may be read from the associated memory array 425. The data may be transmitted from the memory array 425 to the second circuit 440 via the I/O logic component 455. The second circuit 440 may generate a second set of intermediate parity bits using the data read from the memory array 425. The second set of intermediate parity bits may include a lesser quantity of bits than read from the memory array 425. For example, the second circuit 440 may receive one hundred twenty-eight (128) data bits and may generate eight (8) intermediate parity bits. However, in other examples, the second circuit 440 may receive a greater or lesser quantity of data bits and may generate a greater or lesser quantity of intermediate parity bits.

In some examples, the memory device 405 may include a third circuit 445 for generating a set of parity bits based on the intermediate parity bits generated by the first circuit 435 and the second circuit 440. The third circuit 445 may be an example of a bitwise XOR that includes a plurality of XOR gates. For example, the third circuit 445 may perform a binary operation that takes two bit patterns of equal length (e.g., the first set of intermediate parity bits and the second set of intermediate parity bits) and performs an XOR operation on each pair of corresponding bits. The third circuit 445 may thus generate a set of parity bits (e.g., a second set of parity bits) using the address received by the CA inputs 410 and the data read from the memory array 425. The second set of parity bits may include a same quantity of bits as the quantities of bits generated by the first circuit 435 and the second circuit 440. For example, the third circuit 445 may generate eight (8) parity bits that may be transmitted to the error control component 450.

The memory device 405 may include an error control component 450 for determining whether the second set of parity bits generated by the third circuit 445 matches a first set of parity bits associated with the data read from the memory array 425. As described with reference to FIG. 3, when the data was written to the memory array 425 (e.g., to a first portion of the memory array), a corresponding first set of parity bits was also written to the memory array (e.g., to a second portion of the memory array). Accordingly, during the read operation described herein, the first set of parity bits may be read from the memory array 425 and transmitted to the error control component 450 via the I/O logic component 455. The error control component 450 may compare the respective sets of parity bits. If the sets of parity bits match, then errors associated with the data or with the address path may not exist and the data read from the memory array 425 may be transmitted to a host device via the data I/O component 430. However, if the sets of parity bits do not match, then an error may exist with the data, the address path, or both. In such examples, as described herein, additional error detection and correction operations may be performed to determine whether the error is associated with the data, the address path, or both.

By including the first circuit 435, the second circuit 440), and the third circuit 445 in the memory device, the address bits received by the CA inputs 410 may not be routed to each memory array 425 for parity generation. That is, the address bits may be routed to the first circuit 435, which may then generate the first set of intermediate parity bits, which may be routed to each of the memory arrays 425. The first circuit may be located close to the command address inputs 410. As described herein, the first set of intermediate parity bits may include a lesser quantity of bits than the received address bits. Accordingly, fewer bits may then be routed to different memory arrays 425 of the memory device 405. Accordingly, the size of memory device 405 may be reduced as compared to routing each of the address bits for generation of parity information at the memory arrays 425 by including and/or utilizing the first circuit 435, the second circuit 440, and the third circuit 445.

In some examples, the memory device 405 may not utilize the first circuit 435, the second circuit 440), or the third circuit 445 to compare the sets of parity bits. Instead, address bits may be transmitted from the CA inputs 410 to the error control component 450 and the data and corresponding first set of parity bits may be read from the memory array 425 and transmitted to the error control component 450 via the I/O logic component 455. The error control component 330 may then generate a second set of parity bits, based on the address and data read from the memory array 425, using an error control code such as a Hamming code. The error control component 450 may then compare the respective sets of parity bits to determine whether any errors associated with the data or address path (or both) exist.

The error control component 450) may be coupled the data I/O component 430 and may output an indicator (e.g., a flag, a signal) based on comparing the sets of parity bits. For example, the indicator may notify a host device whether the sets of parity bits match (e.g., whether an error may exist with the data, the address path, or both). In some instances, if the parity bits match, the data I/O component 430) may also transmit the read data to the host device.

Although the memory device 405 illustrates various components being coupled with others, any of the components of the memory device 405 may be coupled together (or may not be coupled together despite being illustrated as such). Moreover, some components may be optional components and thus may not be implemented in a memory device 405. However, the memory device 405 may be configured to generate one or more sets of parity bits, which may be used to determine whether errors or faults exist in an address path coupled with the memory device 405 (e.g., coupled with the CA inputs 410). Determining whether an error or fault exists in an address path may prevent unintended or undesirable errors that may otherwise occur due to writing data to or reading data from an incorrect location of a memory array 425.

Figure 5:
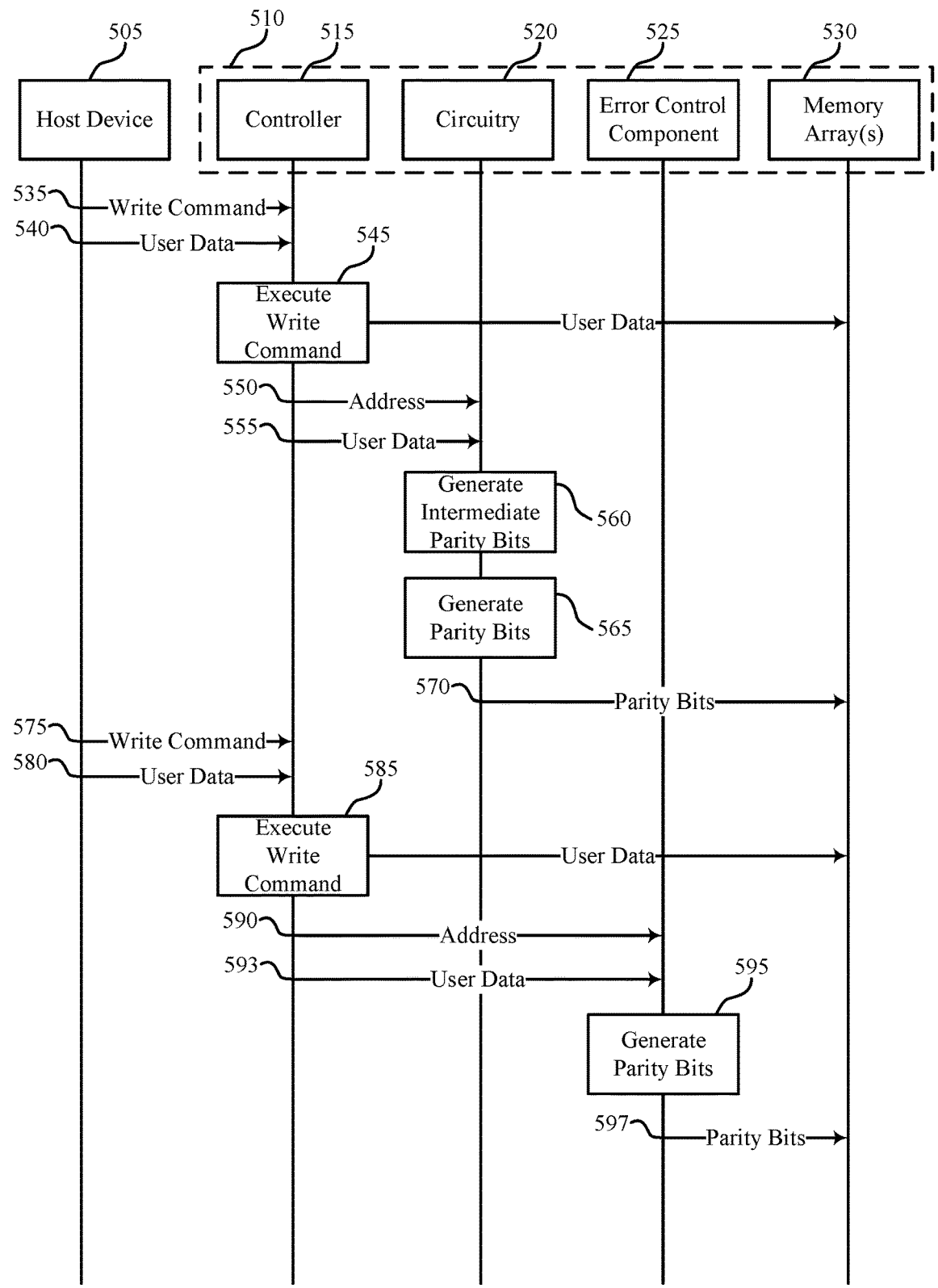
FIG. 5 illustrates an example of a process flow diagram that supports address fault detection in accordance with examples as disclosed herein.

FIG. 5 illustrates an example of a process flow diagram 500 that supports address fault detection in accordance with examples as disclosed herein. The process flow diagram 500 may illustrate operations performed by a host device 505 and a memory device 510. In some examples the host device 505 may be an example of the host device 105 as described with reference to FIG. 1 and the memory device 510 may be an example of the memory device 305 as described with reference to FIG. 3. The memory device 510 may include a controller 515, circuitry 520, an error control component 525, and one or more memory arrays 530. The memory device 510 may include other components that are not shown, such as CA inputs, buffers, control registers, data I/Os, and additional circuits, among other features.

The memory device 510 may be configured to receive a write command from the host device 505, execute the write command, and generate a set of parity bits based on an address (e.g., an address of the write command) and the user data associated with the write command. Although FIG. 5 illustrates commands and data being received by a controller 515, the commands and data may be received at CA inputs and a data I/O as described with reference to FIG. 3. That is, the controller 515 may execute the command upon it being received at a CA input and data I/O. Moreover, the circuitry 520 illustrated in FIG. 5 may be representative of multiple circuits. For example, the circuitry 520 may represent a first circuit (e.g., a first circuit 335 as described with reference to FIG. 3), a second circuit (e.g., a second circuit 340 as described with reference to FIG. 3), and a third circuit (e.g., a third circuit 345 as described with reference to FIG. 3) and is thus described accordingly. The memory device 510 may be configured to determine whether an error or fault exists in an address path, which may prevent unintended or undesirable errors that may otherwise occur due to writing data to or reading data from an incorrect location of a memory array 530.

At 535, the host device 505 may transmit a write command to the memory device 510. In some examples, the write command may include or be associated with an address of a memory array 530 and may be transmitted via a CA bus or a CA channel (e.g., a CA channel 186 as described with reference to FIG. 1). At 540, the host device may transmit user data associated with the write command to the memory device 510. The write command and user data may be transmitted concurrently or serially. In some examples, the user data may be transmitted via a data bus or a DQ channel (e.g., a DQ channel 190 as described with refence to FIG. 1).

At 545, the controller 515 may execute the write command. In some examples, additional circuitry of the memory device 510 may decode the received address (e.g., the address received at 535) into a row address and a column address. The controller may write the user data (e.g., the user data received at 540) to the row and column address of the respective memory array 530.

At 550, the controller 515 may transmit the received address (e.g., the address received at 535) to the circuitry 520. In some examples, the controller 515 may transmit the received address to a first circuit as described with reference to FIG. 3. At 555, the controller may transmit the received user data (e.g., the user data received at 540) to a second circuit as described with reference to FIG. 3. In some examples, the operations performed at 550 and 555 may be performed before or in parallel with the operation performed at 545.

At 560, the circuitry 520 may generate respective sets of intermediate parity bits. For example, the first circuit that received the address (e.g., at 550) may generate a first set of intermediate parity bits. As described herein, the first set of intermediate parity bits may be generated using an XOR tree (e.g., the first circuit may include an XOR tree). Moreover, the second circuit that received the user data (e.g., at 555) may generate a second set of intermediate parity bits. The second set of intermediate parity bits may also be generated using an XOR tree (e.g., the second circuit may include an XOR tree).

At 565, the circuitry 520 may generate a set of parity bits (e.g., a first set of parity bits). For example, the third circuit may generate the first set of parity bits using the first set of intermediate parity bits and the second set of intermediate parity bits. As described herein, the first set of parity bits may be generated using a bitwise XOR (e.g., the third circuit may include a bitwise XOR). At 570, the first set of parity bits may be transmitted to (e.g., stored at) the same memory array 530 as the user data was written to (e.g., at 545). In some examples, the first set of parity bits may be stored to a different portion of the memory array 530 as the user data. For example, the first set of parity bits may be stored to a portion of the memory array 530 that is inaccessible to the host device 505.

For exemplary purposes only, the aforementioned steps relating to the second write command may explain an alternative method for generating parity bits by the memory device 510. The alternative method may utilize at least some components as the prior method described with reference to FIG. 5. At 575, the host device 505 may transmit a second write command to the memory device 510. In some examples, the second write command may include or be associated with an address of a memory array 530 and may be transmitted via a CA bus or a CA channel (e.g., a CA channel 186 as described with reference to FIG. 1). At 580, the host device may transmit user data associated with the second write command to the memory device 510. The second write command and user data may be transmitted concurrently or serially. In some examples, the user data may be transmitted via a data bus or a DQ channel (e.g., a DQ channel 190 as described with reference to FIG. 1).

At 585, the controller 515 may execute the second write command. In some examples, additional circuitry of the memory device 510 may decode the received address (e.g., the address received at 575) into a row address and a column address. The controller 515 may write the user data (e.g., the user data received at 580) to the row and column address of the respective memory array 530.

At 590, the controller 515 may transmit the received address (e.g., the address received at 575) to the error control component 525. At 593, the controller may transmit the received user data (e.g., the user data received at 580) to the error control component 525. In some examples, the operations performed at 590 and 593 may be performed before or in parallel with the operation performed at 585.

At 595, the error control component 525 may generate a set of parity bits (e.g., a first set of parity bits). For example, the error control component 525 may generate the first set of parity bits using an error control code, such as a Hamming code. The first set of parity bits may be generated using the address bits (e.g., the bits of the address received at 590) and the user data. At 597, the first set of parity bits may be transmitted to (e.g., stored at) the same memory array 530 as the user data was written to (e.g., at 585). In some examples, the first set of parity bits may be stored to a different portion of the memory array 530 as the user data. For example, the first set of parity bits may be stored to a portion of the memory array 530 that is inaccessible to the host device 505.

Figure 6:
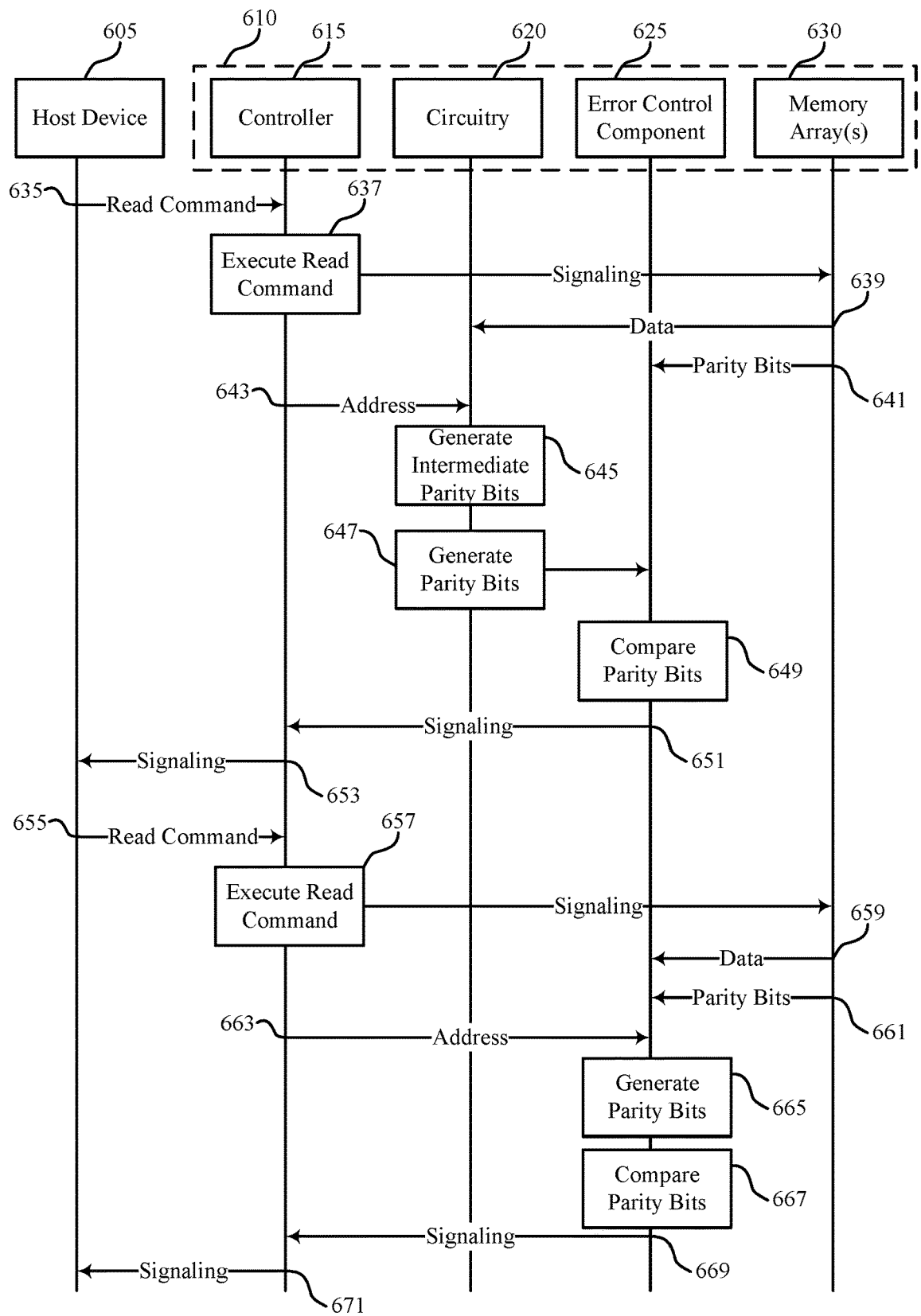
FIG. 6 illustrates an example of a process flow diagram that supports address fault detection in accordance with examples as disclosed herein.

FIG. 6 illustrates an example of a process flow diagram 600 that supports address fault detection in accordance with examples as disclosed herein. The process flow diagram 600 may illustrate operations performed by a host device 605 and a memory device 610. In some examples the host device 605 may be an example of the host device 105 as described with reference to FIG. 1 and the memory device 610 may be an example of the memory device 405 as described with reference to FIG. 4. The memory device 610 may include a controller 615, circuitry 620, an error control component 625, and one or more memory arrays 630. The memory device 610 may include other components that are not shown, such as CA inputs, buffers, control registers, data I/Os, and additional circuits, among other features.

The memory device 610 may be configured to receive a read command from the host device 605, execute the read command, and generate a set of parity bits (e.g., a second set of parity bits) based on an address (e.g., an address of the read command) and the data read from the memory array 630. The memory device 610 may also read a set of parity bits (e.g., a first set of parity bits) from the memory array 630 that is associated with the data and determine whether the first and second sets of parity bits match.

Although FIG. 6 illustrates commands and data being received by a controller 615, read commands may be received at CA inputs as described with reference to FIG. 4 data I/O component described with reference to FIG. 4. That is, the controller 515 may execute received commands and initiate data being output from the memory device 610 to the host device 605. Moreover, the circuitry 620 illustrated in FIG. 6 may be representative of multiple circuits. For example, the circuitry 620 may represent a first circuit (e.g., a first circuit 435 as described with reference to FIG. 4), a second circuit (e.g., a second circuit 440) as described with reference to FIG. 4), and a third circuit (e.g., a third circuit 445 as described with reference to FIG. 4) and is thus described accordingly. The memory device 610 may be configured to determine whether an error or fault exists in an address path, which may prevent unintended or undesirable errors that may otherwise occur due to writing data to or reading data from an incorrect location of a memory array 530.

At 635, the host device 605 may transmit a read command to the memory device 610. In some examples, the read command may include or be associated with an address of a memory array 630 and may be transmitted via a CA bus or a CA channel (e.g., a CA channel 186 as described with reference to FIG. 1). At 637, the controller 615 may execute the read command. In some examples, additional circuitry of the memory device 610 may decode the received address (e.g., the address received at 635) into a row address and a column address. The controller 615 may transmit signaling to the associated memory array 630 to read the data from the decoded row and column address.

At 639, the data may be read from the memory array 630 and transmitted to the circuitry 620 (e.g., to a second circuit). At 641, the first set of parity bits corresponding to the data read from the memory array 630 may be read from the memory array 630 and transmitted to the error control component 625.

At 643, the controller 615 may transmit the received address (e.g., the address received at 635) to the circuitry 620. In some examples, the controller 615 may transmit the received address to a first circuit as described with reference to FIG. 4. In some examples, the operations performed at 643 may be performed before or in parallel with the operations performed at 637 and 639.

At 645, the circuitry 620 may generate respective sets of intermediate parity bits. For example, the first circuit that received the address (e.g., at 643) may generate a first set of intermediate parity bits. As described herein, the first set of intermediate parity bits may be generated using an XOR tree (e.g., the first circuit may include an XOR tree). Moreover, the second circuit that received the data read from the memory array (e.g., at 639) may generate a second set of intermediate parity bits. The second set of intermediate parity bits may also be generated using an XOR tree (e.g., the second circuit may include an XOR tree).

At 647, the circuitry 620 may generate a set of parity bits (e.g., a second set of parity bits). For example, the third circuit may generate the second set of parity bits using the first set of intermediate parity bits and the second set of intermediate parity bits. As described herein, the second set of parity bits may be generated using a bitwise XOR (e.g., the third circuit may include a bitwise XOR). The second set of parity bits may be transmitted to the error control component 625.

At 649, the error control component 625 may compare the first set of parity bits and the second set of parity bits. As described herein, if the sets of parity bits match, neither the data nor the address path may be associated with an error or a fault. However, if the sets of parity bits do not match, then the data, the address path, or both may be associated with an error and further error detection and correction operations may be performed.

At 651, the error control component 625 may transmit signaling to the controller 615 that indicates whether the parity bits match. If the parity bits match, the data may also be transmitted to the controller 615 (e.g., from the memory array 630, from the error control component 625, or from the circuitry 620). At 653, the controller 615 may transmit signaling to the host device 605 that either indicates the parity bits do not match (e.g., that an error exists) or signaling that includes the data read from the memory array 630.

For exemplary purposes only, the aforementioned steps relating to the second read command may explain an alternative method for determining whether sets of parity bits match. The alternative method may utilize at least some components as the prior method described with reference to FIG. 5. At 655, the host device 605 may transmit a second read command to the memory device 610. In some examples, the second read command may include or be associated with an address of a memory array 630 and may be transmitted via a CA bus or a CA channel (e.g., a CA channel 186 as described with reference to FIG. 1).

At 657, the controller 615 may execute the second read command. In some examples, additional circuitry of the memory device 610 may decode the received address (e.g., the address received at 655) into a row address and a column address. The controller 615 may transmit signaling to the associated memory array 630 to read the data from the decoded row and column address.

At 659, the data may be read from the memory array 630 and transmitted to the error control component 625. At 661, the first set of parity bits corresponding to the data read from the memory array 630 may be read from the memory array 630 and transmitted to the error control component 625. At 663, the controller 615 may transmit the received address (e.g., the address received at 655) to the error control component 625. In some examples, the operations performed at 663 may be performed before or in parallel with the operations performed at 659 and 661.

At 665, the error control component 625 may generate a set of parity bits (e.g., a second set of parity bits). For example, the error control component 625 may generate the second set of parity bits using an error control code, such as a Hamming code. The second set of parity bits may be generated using the address bits (e.g., the bits of the address received at 655) and the data read from the memory array 630 (e.g., at 659). At 667, the error control component 625 may compare the first set of parity bits and the second set of parity bits. As described herein, if the sets of parity bits match, neither the data nor the address path may be associated with an error or a fault. However, if the sets of parity bits do not match, then the data, the address path, or both may be associated with an error and further error detection and correction operations may be performed.

At 669, the error control component 625 may transmit signaling to the controller 615 that indicates whether the parity bits match. If the parity bits match, the data may also be transmitted to the controller 615 (e.g., from the memory array 630, from the error control component 625, or from the circuitry 620). At 671, the controller 615 may transmit signaling to the host device 605 that either indicates the parity bits do not match (e.g., that an error exists) or signaling that includes the data read from the memory array 630.

Accordingly, by performing the operations described herein, errors associated with an address path of a memory device 610 may be identified, which may prevent unintended or undesirable errors that may otherwise occur due to writing data to or reading data from an incorrect location.

Figure 7:
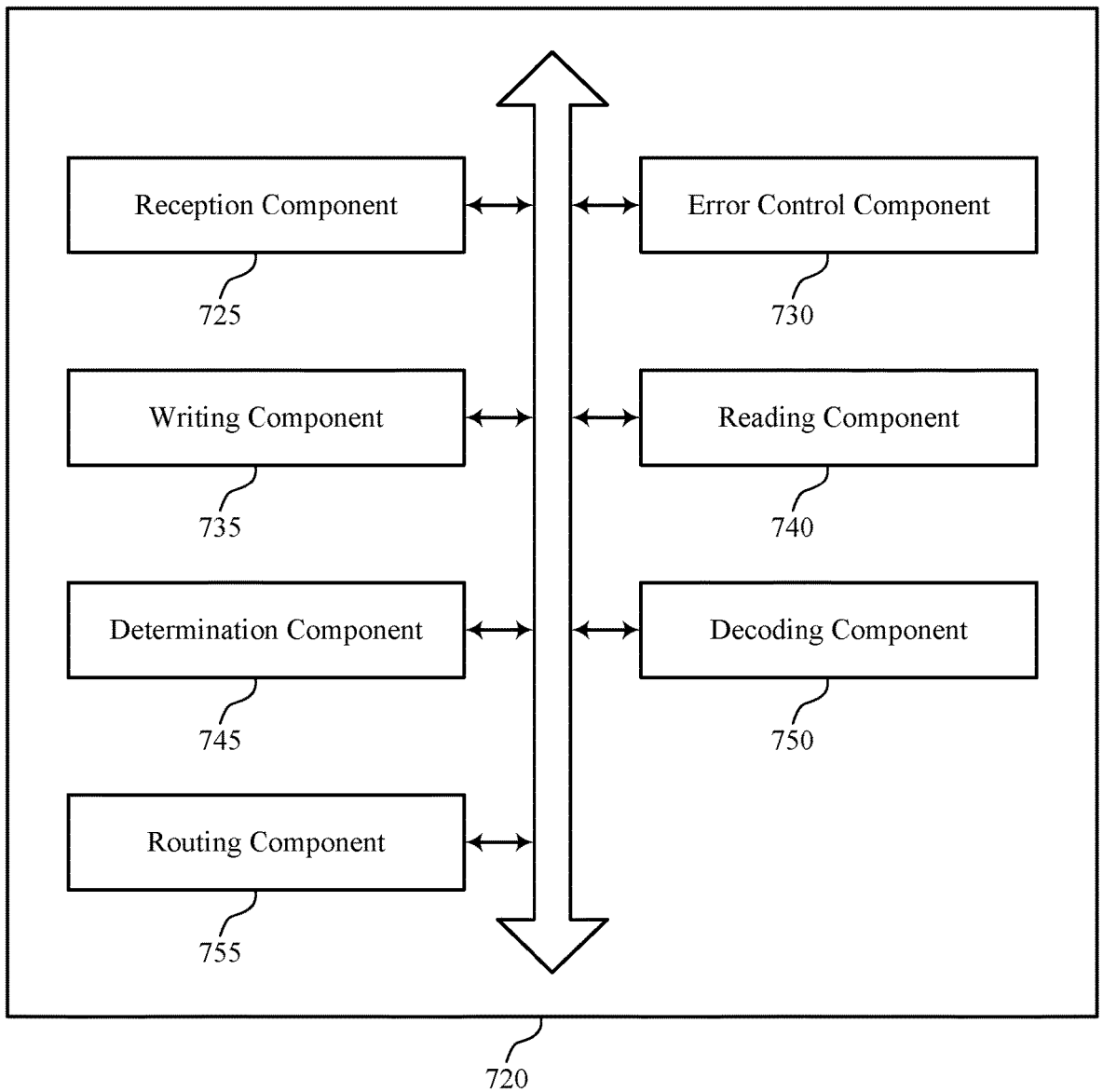
FIG. 7 shows a block diagram of a memory device that supports address fault detection in accordance with examples as disclosed herein.

FIG. 7 shows a block diagram 700 of a memory device 720 that supports address fault detection in accordance with examples as disclosed herein. The memory device 720 may be an example of aspects of a memory device as described with reference to FIGS. 1 through 6. The memory device 720, or various components thereof, may be an example of means for performing various aspects of address fault detection as described herein. For example, the memory device 720 may include a reception component 725, an error control component 730, a writing component 735, a reading component 740, a determination component 745, a decoding component 750, a routing component 755, or any combination thereof. Each of these components may communicate, directly or indirectly, with one another (e.g., via one or more buses).

The reception component 725 may be configured as or otherwise support a means for receiving, at a memory device from a host device via a command/address bus, a command for accessing memory of the memory device, the command including an address of the memory. In some examples, the reception component 725 may be configured as or otherwise support a means for receiving, at the memory device from the host device via a data bus, data to be written to the address of the memory indicated by the command. In some examples, the reception component 725 may be configured as or otherwise support a means for receiving, at a memory device from a host device via a command/address bus, a command for accessing memory of the memory device, the command including an address of the memory from which to read data.

The error control component 730 may be configured as or otherwise support a means for generating, at the memory device using an error control code, a set of parity bits based at least in part on receiving the command and the data, where the set of parity bits is generated using the address of the memory and the data to be written to the address of the memory. In some examples, to support generating the set of parity bits at the memory device using the error control code, the error control component 730 may be configured as or otherwise support a means for generating, during a first operation of the error control code, a first set of intermediate parity bits using the address of the memory included in the command.

In some examples, to support generating the set of parity bits at the memory device using the error control code, the error control component 730 may be configured as or otherwise support a means for generating, during a second operation of the error control code different than the first operation, a second set of intermediate parity bits using the data to be written to the address of the memory. In some examples, the error control component 730) may be configured as or otherwise support a means for generating, during a third operation of the error control code, the set of parity bits based at least in part on the first set of intermediate parity bits and the second set of intermediate parity bits.

In some examples, the error control component 730 may be configured as or otherwise support a means for generating, at the memory device using an error control code, a second set of parity bits based at least in part on reading the data and the first set of parity bits from the memory, where the second set of parity bits is generated using the address of the memory received and the data read from the first portion of the memory. In some examples, to support generating the second set of parity bits at the memory device using the error control code, the error control component 730) may be configured as or otherwise support a means for generating, during a first operation of the error control code, a first set of intermediate parity bits using the address of the memory included in the command.

In some examples, to support generating the second set of parity bits at the memory device using the error control code, the error control component 730 may be configured as or otherwise support a means for generating, during a second operation of the error control code different than the first operation, a second set of intermediate parity bits using the data read from the memory. In some examples, the error control component 730 may be configured as or otherwise support a means for generating, during a third operation of the error control code, the second set of parity bits based at least in part on the first set of intermediate parity bits and the second set of intermediate parity bits.

The writing component 735 may be configured as or otherwise support a means for writing the data and the set of parity bits to memory of the memory device based at least in part on generating the set of parity bits, where the data is written to a first portion of the memory corresponding to the address of the memory and the set of parity bits is written to a second portion of the memory that is different than the first portion of the memory.

The reading component 740 may be configured as or otherwise support a means for reading the data and a first set of parity bits from the memory, where the data is read from a first portion of the memory corresponding to the address and the first set of parity bits is read from a second portion of the memory different than the first portion.

The determination component 745 may be configured as or otherwise support a means for determining at least one error associated with the data read from the memory, the address received, the address of the memory the data is read from, or any combination thereof based at least in part on the first set of parity bits and the second set of parity bits.

In some examples, the decoding component 750 may be configured as or otherwise support a means for decoding the address of the memory included in the command into a row address and a column address based at least in part on receiving the command, where the row address and the column address include respective sets of bits that are different than a set of bits associated with the address. In some examples, the decoding component 750 may be configured as or otherwise support a means for decoding the address of the memory included in the command into a row address and a column address based at least in part on receiving the command, where the row address and the column address include respective sets of bits that are different than a set of bits associated with the address.

In some examples, the routing component 755 may be configured as or otherwise support a means for routing the first set of intermediate parity bits to a first bank of memory of a plurality of banks of memory based at least in part on generating the first set of intermediate parity bits, where the first bank of memory includes the first portion of the memory and the second portion of the memory, and where generating the set of parity bits is based at least in part on routing the first set of intermediate parity bits to the first bank of memory of the plurality of banks of memory.

In some examples, the first set of intermediate parity bits includes a first quantity of bits and the address included in the command includes a second quantity of bits greater than the first quantity of bits. In some examples, the second portion of the memory is not accessible by the host device. In some examples, the first set of intermediate parity bits includes a first quantity of bits and the address included in the command includes a second quantity of bits greater than the first quantity of bits. In some examples, the second portion of the memory is not accessible by the host device.

Figure 8:
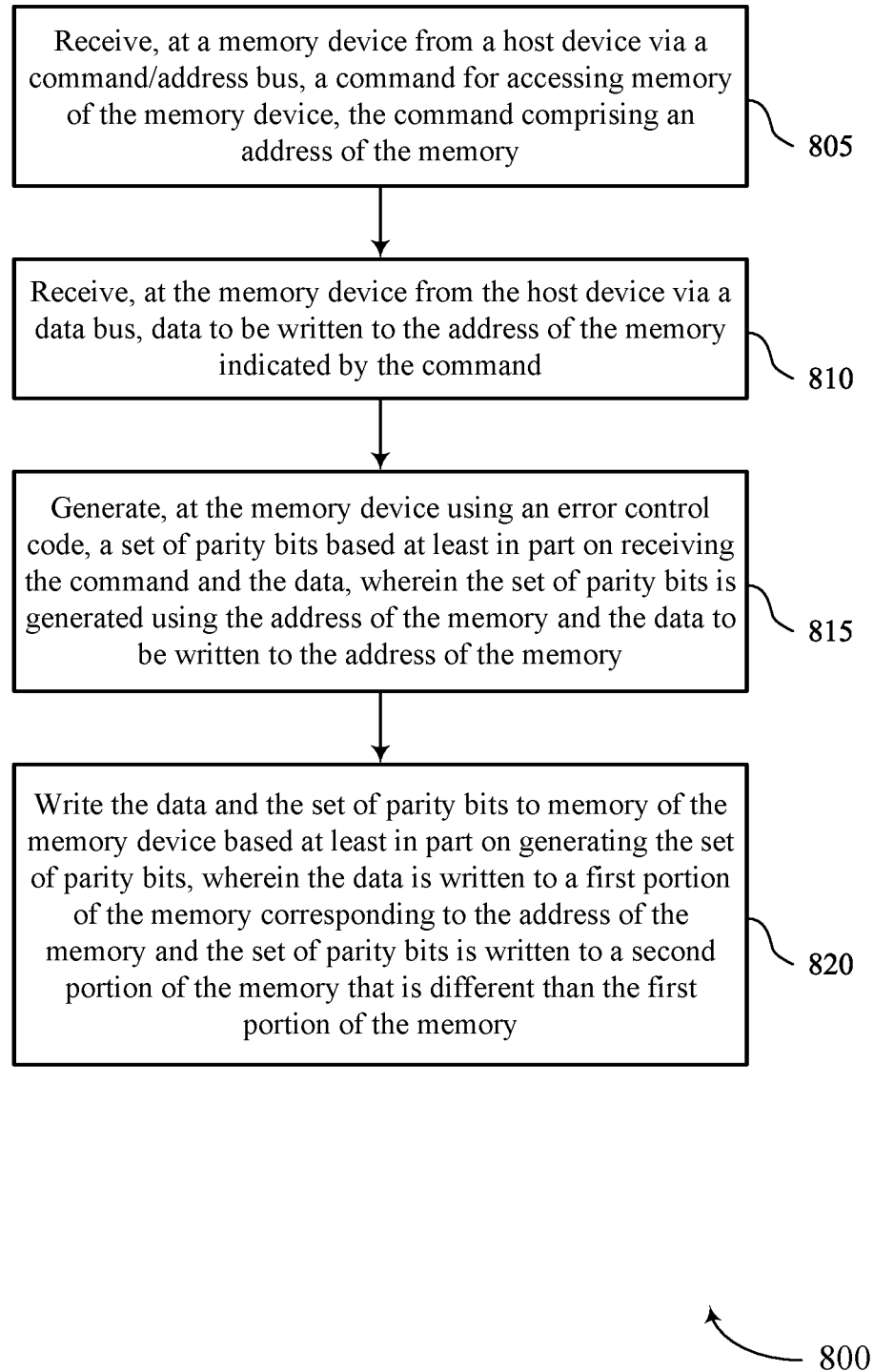
FIGS. 8 and 9 show flowcharts illustrating a method or methods that support address fault detection in accordance with examples as disclosed herein.

FIG. 8 shows a flowchart illustrating a method 800 that supports address fault detection in accordance with examples as disclosed herein. The operations of method 800 may be implemented by a memory device or its components as described herein. For example, the operations of method 800 may be performed by a memory device as described with reference to FIGS. 1 through 7. In some examples, a memory device may execute a set of instructions to control the functional elements of the device to perform the described functions. Additionally or alternatively, the memory device may perform aspects of the described functions using special-purpose hardware.

At 805, the method may include receiving, at a memory device from a host device via a command/address bus, a command for accessing memory of the memory device, the command including an address of the memory. The operations of 805 may be performed in accordance with examples as disclosed herein. In some examples, aspects of the operations of 805 may be performed by a reception component 725 as described with reference to FIG. 7.

At 810, the method may include receiving, at the memory device from the host device via a data bus, data to be written to the address of the memory indicated by the command. The operations of 810 may be performed in accordance with examples as disclosed herein. In some examples, aspects of the operations of 810 may be performed by a reception component 725 as described with reference to FIG. 7.

At 815, the method may include generating, at the memory device using an error control code, a set of parity bits based at least in part on receiving the command and the data, where the set of parity bits is generated using the address of the memory and the data to be written to the address of the memory. The operations of 815 may be performed in accordance with examples as disclosed herein. In some examples, aspects of the operations of 815 may be performed by an error control component 730 as described with reference to FIG. 7.

At 820, the method may include writing the data and the set of parity bits to memory of the memory device based at least in part on generating the set of parity bits, where the data is written to a first portion of the memory corresponding to the address of the memory and the set of parity bits is written to a second portion of the memory that is different than the first portion of the memory. The operations of 820 may be performed in accordance with examples as disclosed herein. In some examples, aspects of the operations of 820 may be performed by a writing component 735 as described with reference to FIG. 7.

In some examples, an apparatus as described herein may perform a method or methods, such as the method 800. The apparatus may include, features, circuitry, logic, means, or instructions (e.g., a non-transitory computer-readable medium storing instructions executable by a processor), or any combination thereof for performing the following aspects of the present disclosure:

Aspect 1: The apparatus, including features, circuitry, logic, means, or instructions, or any combination thereof for receiving, at a memory device from a host device via a command/address bus, a command for accessing memory of the memory device, the command including an address of the memory: receiving, at the memory device from the host device via a data bus, data to be written to the address of the memory indicated by the command: generating, at the memory device using an error control code, a set of parity bits based at least in part on receiving the command and the data, where the set of parity bits is generated using the address of the memory and the data to be written to the address of the memory; and writing the data and the set of parity bits to memory of the memory device based at least in part on generating the set of parity bits, where the data is written to a first portion of the memory corresponding to the address of the memory and the set of parity bits is written to a second portion of the memory that is different than the first portion of the memory.

Aspect 2: The apparatus of aspect 1 where generating the set of parity bits at the memory device using the error control code, further includes operations, features, circuitry, logic, means, or instructions, or any combination thereof for generating, during a first operation of the error control code, a first set of intermediate parity bits using the address of the memory included in the command and generating, during a second operation of the error control code different than the first operation, a second set of intermediate parity bits using the data to be written to the address of the memory.

Aspect 3: The apparatus of aspect 2, further including operations, features, circuitry, logic, means, or instructions, or any combination thereof for generating, during a third operation of the error control code, the set of parity bits based at least in part on the first set of intermediate parity bits and the second set of intermediate parity bits.

Aspect 4: The apparatus of aspect 3, further including operations, features, circuitry, logic, means, or instructions, or any combination thereof for routing the first set of intermediate parity bits to a first bank of memory of a plurality of banks of memory based at least in part on generating the first set of intermediate parity bits, where the first bank of memory includes the first portion of the memory and the second portion of the memory, and where generating the set of parity bits is based at least in part on routing the first set of intermediate parity bits to the first bank of memory of the plurality of banks of memory.

Aspect 5: The apparatus of any of aspects 2 through 4, further including operations, features, circuitry, logic, means, or instructions, or any combination thereof for the first set of intermediate parity bits includes a first quantity of bits and the address included in the command includes a second quantity of bits greater than the first quantity of bits.

Aspect 6: The apparatus of any of aspects 1 through 5, further including operations, features, circuitry, logic, means, or instructions, or any combination thereof for decoding the address of the memory included in the command into a row address and a column address based at least in part on receiving the command, where the row address and the column address include respective sets of bits that are different than a set of bits associated with the address.

Aspect 7: The apparatus of any of aspects 1 through 6, further including operations, features, circuitry, logic, means, or instructions, or any combination thereof for the second portion of the memory is not accessible by the host device.

Figure 9:
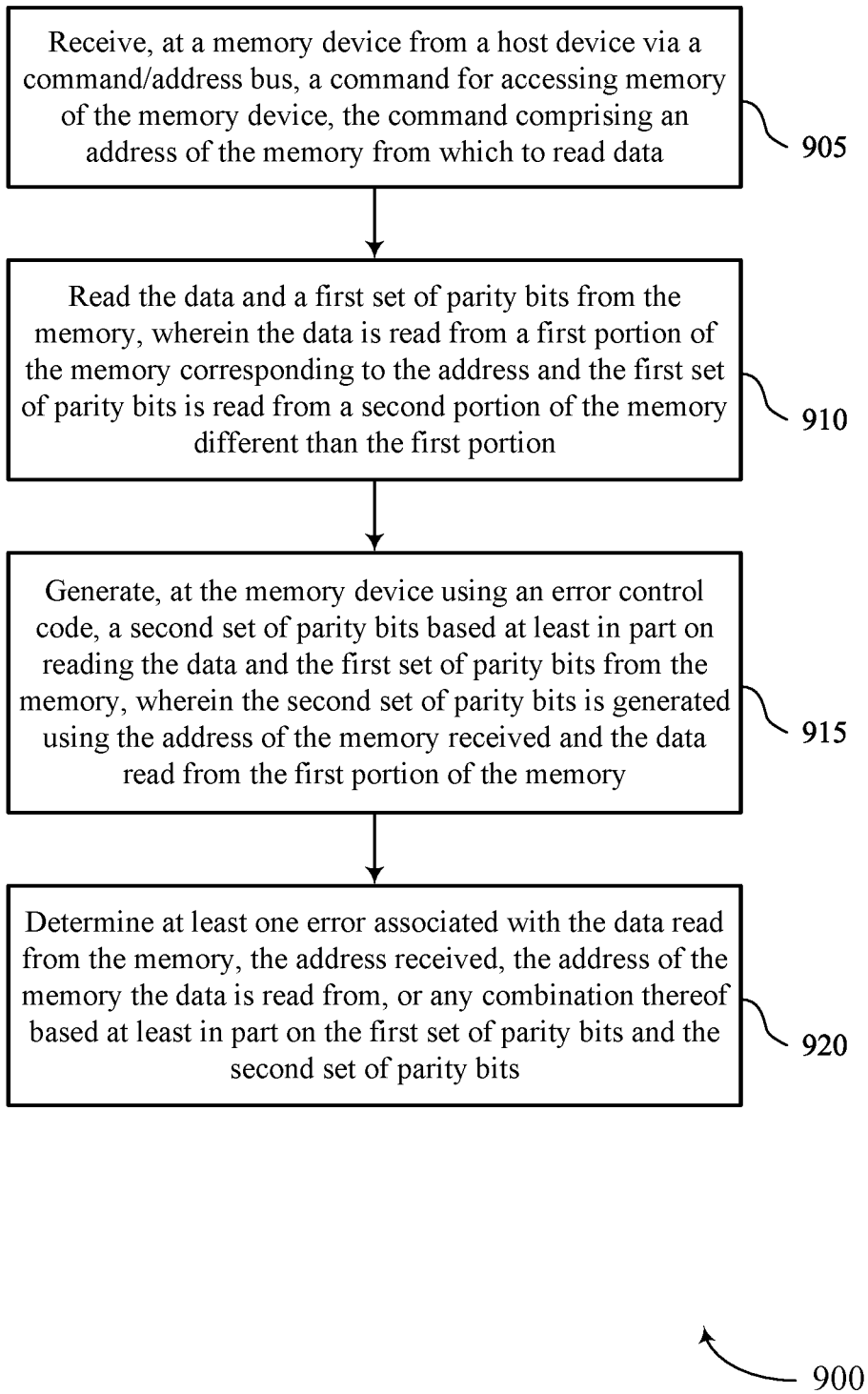

FIG. 9 shows a flowchart illustrating a method 900 that supports address fault detection in accordance with examples as disclosed herein. The operations of method 900 may be implemented by a memory device or its components as described herein. For example, the operations of method 900 may be performed by a memory device as described with reference to FIGS. 1 through 7. In some examples, a memory device may execute a set of instructions to control the functional elements of the device to perform the described functions. Additionally or alternatively, the memory device may perform aspects of the described functions using special-purpose hardware.

At 905, the method may include receiving, at a memory device from a host device via a command/address bus, a command for accessing memory of the memory device, the command including an address of the memory from which to read data. The operations of 905 may be performed in accordance with examples as disclosed herein. In some examples, aspects of the operations of 905 may be performed by a reception component 725 as described with reference to FIG. 7.

At 910, the method may include reading the data and a first set of parity bits from the memory, where the data is read from a first portion of the memory corresponding to the address and the first set of parity bits is read from a second portion of the memory different than the first portion. The operations of 910 may be performed in accordance with examples as disclosed herein. In some examples, aspects of the operations of 910 may be performed by a reading component 740 as described with reference to FIG. 7.

At 915, the method may include generating, at the memory device using an error control code, a second set of parity bits based at least in part on reading the data and the first set of parity bits from the memory, where the second set of parity bits is generated using the address of the memory received and the data read from the first portion of the memory. The operations of 915 may be performed in accordance with examples as disclosed herein. In some examples, aspects of the operations of 915 may be performed by an error control component 730 as described with reference to FIG. 7.

At 920, the method may include determining at least one error associated with the data read from the memory, the address received, the address of the memory the data is read from, or any combination thereof based at least in part on the first set of parity bits and the second set of parity bits. The operations of 920 may be performed in accordance with examples as disclosed herein. In some examples, aspects of the operations of 920 may be performed by a determination component 745 as described with reference to FIG. 7.

In some examples, an apparatus as described herein may perform a method or methods, such as the method 900. The apparatus may include, features, circuitry, logic, means, or instructions (e.g., a non-transitory computer-readable medium storing instructions executable by a processor), or any combination thereof for performing the following aspects of the present disclosure:

Aspect 8: The apparatus, including features, circuitry, logic, means, or instructions, or any combination thereof for receiving, at a memory device from a host device via a command/address bus, a command for accessing memory of the memory device, the command including an address of the memory from which to read data: reading the data and a first set of parity bits from the memory, where the data is read from a first portion of the memory corresponding to the address and the first set of parity bits is read from a second portion of the memory different than the first portion: generating, at the memory device using an error control code, a second set of parity bits based at least in part on reading the data and the first set of parity bits from the memory, where the second set of parity bits is generated using the address of the memory received and the data read from the first portion of the memory; and determining at least one error associated with the data read from the memory, the address received, the address of the memory the data is read from, or any combination thereof based at least in part on the first set of parity bits and the second set of parity bits.

Aspect 9: The apparatus of aspect 8 where generating the second set of parity bits at the memory device using the error control code, further includes operations, features, circuitry, logic, means, or instructions, or any combination thereof for generating, during a first operation of the error control code, a first set of intermediate parity bits using the address of the memory included in the command and generating, during a second operation of the error control code different than the first operation, a second set of intermediate parity bits using the data read from the memory.

Aspect 10: The apparatus of aspect 9, further including operations, features, circuitry, logic, means, or instructions, or any combination thereof for generating, during a third operation of the error control code, the second set of parity bits based at least in part on the first set of intermediate parity bits and the second set of intermediate parity bits.

Aspect 11: The apparatus of any of aspects 9 through 10, further including operations, features, circuitry, logic, means, or instructions, or any combination thereof for the first set of intermediate parity bits includes a first quantity of bits and the address included in the command includes a second quantity of bits greater than the first quantity of bits.

Aspect 12: The apparatus of any of aspects 8 through 11, further including operations, features, circuitry, logic, means, or instructions, or any combination thereof for decoding the address of the memory included in the command into a row address and a column address based at least in part on receiving the command, where the row address and the column address include respective sets of bits that are different than a set of bits associated with the address.

Aspect 13: The apparatus of any of aspects 8 through 12, further including operations, features, circuitry, logic, means, or instructions, or any combination thereof for the second portion of the memory is not accessible by the host device.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 14: An apparatus, including: an interface of a memory device that is configured to be coupled with a host device and configured to receive a command for accessing memory of the memory device, where the command includes an address of a first bank of memory of the memory device and data to be written to the address of the first bank of memory: a first circuit coupled with the interface and configured to generate a first set of intermediate parity bits associated with the address of the first bank of memory using an error control code: a plurality of banks of memory coupled with the first circuit, where the plurality of banks of memory includes the first bank of memory, and where the first bank of memory includes a memory array and a first data path logic for receiving the first set of intermediate parity bits from the first circuit: a second circuit associated with the first bank of memory and configured to generate a second set of intermediate parity bits associated with the data to be written to the address of the first bank of memory using the error control code; and a third circuit coupled with the second circuit and each of the plurality of banks of memory, where the third circuit is configured to generate a set of parity bits using the first set of intermediate parity bits and the second set of intermediate parity bits according to the error control code, where a first portion of the first bank of memory corresponding to the address of the first bank of memory is configured to store the data and a second portion of the first bank of memory that is different than the first portion of the first bank of memory is configured to store the set of parity bits.

Aspect 15: The apparatus of aspect 14, where the third circuit includes an exclusive or logic gate and is configured to generate the set of parity bits by performing an exclusive or operation on the first set of intermediate parity bits and the second set of intermediate parity bits.

Aspect 16: The apparatus of any of aspects 14 through 15, where the interface is configured to decode the address of the first bank of memory included in the command based at least in part on receiving the command, and the first circuit is configured to route the first set of intermediate parity bits to the first bank of memory.

Aspect 17: The apparatus of any of aspects 14 through 16, where the first set of intermediate parity bits includes a first quantity of bits and the address included in the command includes a second quantity of bits greater than the first quantity of bits.

Aspect 18: The apparatus of any of aspects 14 through 17, where the second portion of the memory is not accessible by the host device.

An apparatus is described. The following provides an overview of aspects of the apparatus as described herein:

Aspect 19: An apparatus, including: an interface configured to be coupled with a host device and configured to receive a command for accessing memory of a memory device and data to be written to an address of the memory, the command including the address of the memory: error control logic coupled with the interface; and a controller coupled with the interface and the error control logic, where the controller is operable to cause the apparatus to: generate, by the error control logic using the address of the memory and the data to be written to the address of the memory, a set of parity bits based at least in part on the interface receiving the command from the host device; and write, based at least in part on generating the set of parity bits, the data to a first portion of the memory corresponding to the address of the memory, and the set of parity bits to a second portion of the memory that is different than the first portion of the memory.

Aspect 20: The apparatus of aspect 19, where to generate the set of parity bits by the error control logic, the controller is operable to cause the apparatus to: generate, during a first operation performed by the error control logic, a first set of intermediate parity bits using the address of the memory included in the command; and generating, during a second operation performed by the error control logic that is different than the first operation, a second set of intermediate parity bits using the data to be written to the address of the memory.

Aspect 21: The apparatus of aspect 20, where the controller is operable to cause the apparatus to generate, during a third operation performed by the error control logic, the set of parity bits based at least in part on the first set of intermediate parity bits and the second set of intermediate parity bits.

Aspect 22: The apparatus of aspect 21, where the controller is operable to cause the apparatus to: route the first set of intermediate parity bits to a first bank of memory of a plurality of banks of memory based at least in part on generating the first set of intermediate parity bits, where the first bank of memory includes the first portion of the memory and the second portion of the memory, and where generating the set of parity bits is based at least in part on routing the first set of intermediate parity bits to the first bank of memory of the plurality of banks of memory.

Aspect 23: The apparatus of aspect 22, where the first set of intermediate parity bits includes a first quantity of bits and the address included in the command includes a second quantity of bits greater than the first quantity of bits.

Aspect 24: The apparatus of any of aspects 19 through 23, where the controller is operable to cause the apparatus to: decode, by the interface, the address of the memory included in the command into a row address and a column address based at least in part on receiving the command, where the row address and the column address include respective sets of bits that are different than a set of bits associated with the address.

Aspect 25: The apparatus of any of aspects 19 through 24, where the second portion of the memory is not accessible by the host device.

An apparatus is described. The following provides an overview of aspects of the apparatus as described herein:

Aspect 26: An apparatus, including: an interface configured to be coupled with a host device and configured to receive a command for accessing memory of a memory device, the command including an address of the memory from which to read data: error control logic coupled with the interface; and a controller coupled with the interface and the error control logic, where the controller is operable to cause the apparatus to: read the data, from a first portion of the memory corresponding to the address, and a first set of parity, from a second portion of the memory different than the first portion: generate, by the error control logic using the address of the memory received from the host device and the data read from the first portion of the memory, a second set of parity bits based at least in part on reading the data and the first set of parity bits from the memory; and determine at least one error associated with the data read from the memory, the address received from the host device, the address of the memory the data is read from, or any combination thereof based at least in part on the first set of parity bits and the second set of parity bits.

Aspect 27: The apparatus of aspect 26, where to generate the second set of parity bits by the error control logic, the controller is operable to cause the apparatus to: generate, during a first operation performed by the error control logic, a first set of intermediate parity bits using the address of the memory included in the command; and generate, during a second operation performed by the error control logic that is different than the first operation, a second set of intermediate parity bits using the data read from the memory.

Aspect 28: The apparatus of aspect 27, where the controller is operable to cause the apparatus to generate, during a third operation performed by the error control logic, the second set of parity bits based at least in part on the first set of intermediate parity bits and the second set of intermediate parity bits.

Aspect 29: The apparatus of any of aspects 27 through 28, where the first set of intermediate parity bits includes a first quantity of bits and the address included in the command includes a second quantity of bits greater than the first quantity of bits.

Aspect 30: The apparatus of any of aspects 26 through 29, where the controller is operable to cause the apparatus to: decode, by the interface, the address of the memory included in the command into a row address and a column address based at least in part on receiving the command, where the row address and the column address include respective sets of bits that are different than a set of bits associated with the address.

Aspect 31: The apparatus of any of aspects 26 through 30, where the second portion of the memory is not accessible by the host device.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal: however, the signal may represent a bus of signals, where the bus may have a variety of bit widths.

The terms "electronic communication," "conductive contact." "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   receiving, at a memory device from a host device via a command/address bus, a command for accessing memory of the memory device, the command comprising an address of the memory;
   receiving, at the memory device from the host device via a data bus, data to be written to the address of the memory indicated by the command;
   generating, at the memory device using an error control code, a set of parity bits based at least in part on receiving the command and the data, wherein the set of parity bits is generated using the address of the memory and the data to be written to the address of the memory; and
   writing the data and the set of parity bits to memory of the memory device, wherein the data is written to a first portion of the memory corresponding to the address of the memory and the set of parity bits is written to a second portion of the memory that is different than the first portion of the memory.

2. The method of claim 1, wherein generating the set of parity bits at the memory device using the error control code comprises:
   generating, during a first operation of the error control code, a first set of intermediate parity bits using the address of the memory included in the command; and
   generating, during a second operation of the error control code different than the first operation, a second set of intermediate parity bits using the data to be written to the address of the memory.

3. The method of claim 2, further comprising:
   generating, during a third operation of the error control code, the set of parity bits based at least in part on the first set of intermediate parity bits and the second set of intermediate parity bits.

4. The method of claim 3, further comprising:
   routing the first set of intermediate parity bits to a first bank of memory of a plurality of banks of memory based at least in part on generating the first set of intermediate parity bits, wherein the first bank of memory includes the first portion of the memory and the second portion of the memory, and wherein generating the set of parity bits is based at least in part on routing the first set of intermediate parity bits to the first bank of memory of the plurality of banks of memory.

5. The method of claim 2, wherein the first set of intermediate parity bits comprises a first quantity of bits and the address included in the command comprises a second quantity of bits greater than the first quantity of bits.

6. The method of claim 1, further comprising:
   decoding the address of the memory included in the command into a row address and a column address based at least in part on receiving the command, wherein the row address and the column address comprise respective sets of bits that are different than a set of bits associated with the address.

7. The method of claim 1, wherein the second portion of the memory is not accessible by the host device.

8. A method, comprising:
receiving, at a memory device from a host device via a command/address bus, a command for accessing memory of the memory device, the command comprising an address of the memory from which to read data;
reading the data and a first set of parity bits from the memory, wherein the data is read from a first portion of the memory corresponding to the address and the first set of parity bits is read from a second portion of the memory different than the first portion;
generating, at the memory device using an error control code, a second set of parity bits based at least in part on reading the data and the first set of parity bits from the memory, wherein the second set of parity bits is generated using the address of the memory received and the data read from the first portion of the memory; and
determining at least one error associated with the data read from the memory, the address received, the address of the memory the data is read from, or any combination thereof based at least in part on the first set of parity bits and the second set of parity bits.

9. The method of claim 8, wherein generating the second set of parity bits at the memory device using the error control code comprises:
generating, during a first operation of the error control code, a first set of intermediate parity bits using the address of the memory included in the command.

10. The method of claim 9, further comprising:
generating, during a second operation of the error control code different than the first operation, a second set of intermediate parity bits using the data read from the memory.

11. The method of claim 10, wherein the first set of intermediate parity bits comprises a first quantity of bits and the address included in the command comprises a second quantity of bits greater than the first quantity of bits.

12. The method of claim 10, further comprising:
generating, during a third operation of the error control code, the second set of parity bits based at least in part on the first set of intermediate parity bits and the second set of intermediate parity bits.

13. The method of claim 8, further comprising:
decoding the address of the memory included in the command into a row address and a column address based at least in part on receiving the command, wherein the row address and the column address comprise respective sets of bits that are different than a set of bits associated with the address.

14. The method of claim 8, wherein the second portion of the memory is not accessible by the host device.

15. An apparatus, comprising:
an interface of a memory device that is configured to be coupled with a host device and configured to receive a command for accessing memory of the memory device, wherein the command comprises an address of a first bank of memory of the memory device and data to be written to the address of the first bank of memory;
a first circuit coupled with the interface and configured to generate a first set of intermediate parity bits associated with the address of the first bank of memory using an error control code;
a plurality of banks of memory coupled with the first circuit, wherein the plurality of banks of memory comprises the first bank of memory, and wherein the first bank of memory comprises a memory array and a first data path logic for receiving the first set of intermediate parity bits from the first circuit;
a second circuit associated with the first bank of memory and configured to generate a second set of intermediate parity bits associated with the data to be written to the address of the first bank of memory using the error control code; and
a third circuit coupled with the second circuit and each of the plurality of banks of memory, wherein the third circuit is configured to generate a set of parity bits using the first set of intermediate parity bits and the second set of intermediate parity bits according to the error control code, wherein a first portion of the first bank of memory corresponding to the address of the first bank of memory is configured to store the data and a second portion of the first bank of memory that is different than the first portion of the first bank of memory is configured to store the set of parity bits.

16. The apparatus of claim 15, wherein the third circuit comprises an exclusive or logic gate and is configured to generate the set of parity bits by performing an exclusive or operation on the first set of intermediate parity bits and the second set of intermediate parity bits.

17. The apparatus of claim 15, wherein the interface is configured to decode the address of the first bank of memory included in the command based at least in part on receiving the command.

18. The apparatus of claim 15, wherein the first set of intermediate parity bits comprises a first quantity of bits and the address included in the command comprises a second quantity of bits greater than the first quantity of bits.

19. The apparatus of claim 15, wherein the second portion of the memory is not accessible by the host device.

20. The apparatus of claim 15, wherein the first circuit is configured to route the first set of intermediate parity bits to the first bank of memory.

* * * * *